United States Patent
Chiba et al.

(10) Patent No.: US 11,213,133 B2
(45) Date of Patent: Jan. 4, 2022

(54) DIELECTRIC ELASTOMER DRIVE SENSOR SYSTEM AND SHEET

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Hironobu Kondo, Kariya (JP); Masahiro Ishikawa, Kariya (JP); Keiji Osugi, Kariya (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 0 days.

(21) Appl. No.: 16/766,288

(22) PCT Filed: Nov. 26, 2018

(86) PCT No.: PCT/JP2018/043396
§ 371 (c)(1),
(2) Date: May 22, 2020

(87) PCT Pub. No.: WO2019/107309
PCT Pub. Date: Jun. 6, 2019

(65) Prior Publication Data
US 2021/0022510 A1   Jan. 28, 2021

(30) Foreign Application Priority Data
Nov. 28, 2017   (JP) .............................. JP2017-227439

(51) Int. Cl.
*A47C 7/62*   (2006.01)
*H02N 11/00*   (2006.01)
(Continued)

(52) U.S. Cl.
CPC .................. *A47C 7/62* (2013.01); *B60N 2/90* (2018.02); *H02N 11/00* (2013.01); *H01L 41/193* (2013.01)

(58) Field of Classification Search
CPC . A47C 7/62; B60N 2/90; B60N 2/976; B60N 2/002; H02N 11/00; H01L 41/193; H01L 41/0825
See application file for complete search history.

(56) References Cited

U.S. PATENT DOCUMENTS 8,222,799 B2 * 7/2012 Polyakov ............ H01L 41/0474
310/365
2004/0230090 A1 * 11/2004 Hegde ..................... H01L 41/27
600/18
(Continued)

FOREIGN PATENT DOCUMENTS

JP   2010042078 A   2/2010
JP   2011223813 A   11/2011
(Continued)

OTHER PUBLICATIONS

Feb. 26, 2019, International Search Report issued in the International Patent Application No. PCT/JP2018/043396.
(Continued)

*Primary Examiner* — Michael C Zarroli
(74) *Attorney, Agent, or Firm* — Kenja IP Law PC

(57) ABSTRACT

A dielectric elastomer driving sensor system includes: a dielectric elastomer transducer portion including a dielectric elastomer layer and a pair of electrode layers that sandwich the dielectric elastomer layer, where the pair of electrode layers include a driving region and a sensor region that are partitioned from each other; a power supply unit that applies a voltage to the driving region; a detection unit that detects a change in capacitance in the sensor region; and a control unit that controls the power supply unit and the detection
(Continued)

unit. With this configuration, both the driving function and the sensor function can be performed.

11 Claims, 6 Drawing Sheets

(51) Int. Cl.
    *H01L 41/193*     (2006.01)
    *B60N 2/90*     (2018.01)

(56) References Cited

U.S. PATENT DOCUMENTS

| | | | | |
|---|---|---|---|---|
| 2006/0028743 | A1* | 2/2006 | Yamashita | G02B 7/023 |
| | | | | 359/824 |
| 2017/0199022 | A1* | 7/2017 | Anderson | G01L 1/146 |
| 2018/0053386 | A1* | 2/2018 | Ebrahimi Takalloo | |
| | | | | H01L 41/094 |
| 2019/0103549 | A1* | 4/2019 | Duduta | C08G 59/18 |

FOREIGN PATENT DOCUMENTS

| | | |
|---|---|---|
| JP | 2012060821 A | 3/2012 |
| JP | 2016054605 A | 4/2016 |
| JP | 2016121758 A | 7/2016 |

OTHER PUBLICATIONS

Jul. 23, 2021, the Extended European Search Report issued by the European Patent Office in the corresponding European Patent Application No. 18882980.8.

\* cited by examiner

DIELECTRIC ELASTOMER DRIVE SENSOR SYSTEM AND SHEET

TECHNICAL FIELD

The present invention relates to a dielectric elastomer driving sensor system and a seat.

BACKGROUND ART

A unit having a dielectric elastomer layer and a pair of electrode layers that sandwich the dielectric elastomer layer has an advantage of being able to perform various functions. Patent Document 1 discloses a bedding that uses this kind of unit. In the bedding disclosed in Patent Document 1, a plurality of units in which dielectric elastomer layers are used perform a driving function and a sensor function. In the driving function, it is intended that a repulsion force is distributed by causing each unit to separately generate a repulsion force. In the sensor function, the distribution of the body weight of a person lying on the bedding is detected by detecting a load acting on each of the units. A bedding that is more fitted to the figure of the user can be provided by setting the repulsion force in the driving function on the basis of the load distribution obtained by the sensor function.

PRIOR ART DOCUMENTS

Patent Document

Patent Document 1: JP 2010-42078 A

SUMMARY OF THE INVENTION

Problem to be Solved by the Invention

However, the unit disclosed in Patent Document 1 adopts a configuration which includes two pairs of electrode layers arranged so as to sandwich the dielectric elastomer layer in directions orthogonal to each other, for example. In terms of improving both the driving function and the sensor function, it is advantageous for the area of the pair of electrode layers to be large and the distance between the electrode layers to be small. However, in the above-described unit, the more the area of one pair of the electrode layers is increased and the closer the electrode layers are brought to each other, the smaller the area of the other pair of the electrode layers becomes and the greater the distance between the other pair of electrode layers becomes. As a result, it is difficult to improve both the driving function and the sensor function. Also, Patent Document 1 discloses a configuration of another unit in which both the driving function and the sensor function are used by using a pair of electrode layers that sandwich the dielectric elastomer layer as the driving function and the sensor function by time sharing. However, in this case, for example, in the time period when the sensor function is performed, exertion of the repulsion force is limited in order to perform the driving function. Accordingly, there is a problem in that the above-described configuration is not suitable for an application in which the driving function and the sensor function are required to be performed at the same time, an application in which frequent detection is required, and the like.

The present invention has been proposed under the above-mentioned circumstances, and an object thereof is to provide a dielectric elastomer driving sensor system and a seat that can perform both a driving function and a sensor function.

Means for Solving the Problem

A dielectric elastomer driving sensor system provided according to a first aspect of the present invention includes a dielectric elastomer transducer portion including a dielectric elastomer layer and a pair of electrode layers that sandwich the dielectric elastomer layer, and the pair of electrode layers include a driving region and a sensor region that are partitioned from each other, and the dielectric elastomer driving sensor system further includes a power supply unit configured to apply a voltage to the driving region, a detection unit configured to detect a change in capacitance in the sensor region, and a control unit configured to control the power supply unit and the detection unit.

In a preferred embodiment of the present invention, an area of the driving region is larger than an area of the sensor region.

In a preferred embodiment of the present invention, the dielectric elastomer layer has a tubular shape, and the driving region and the sensor region are arranged in a circumferential direction of the dielectric elastomer layer.

In a preferred embodiment of the present invention, the pair of electrode layers include a plurality of the driving regions and a plurality of the sensor regions.

In a preferred embodiment of the present invention, the plurality of the driving regions and the plurality of the sensor regions are in an arrangement with circumferential periodicity as viewed in an axial direction of the dielectric elastomer layer.

In a preferred embodiment of the present invention, the dielectric elastomer transducer portion further includes a support having a fixed portion and a movable portion that are each attached to the dielectric elastomer layer, and the dielectric elastomer layer is stretched due to an external force being transmitted to the movable portion and the movable portion moving relative to the fixed portion.

A seat provided according to a second aspect of the present invention includes the dielectric elastomer driving sensor system provided according to the first aspect of the present invention, and a seat body to which the dielectric elastomer transducer portion is attached.

According to the present invention, it is possible to perform both a driving function and a sensor function.

Other features and advantages of the present invention will become apparent from the detailed description given below with reference to the accompanying drawings.

MODE FOR CARRYING OUT THE INVENTION

Hereinafter, preferred embodiments of the present invention will be specifically described with reference to the drawings.

Figure 1:
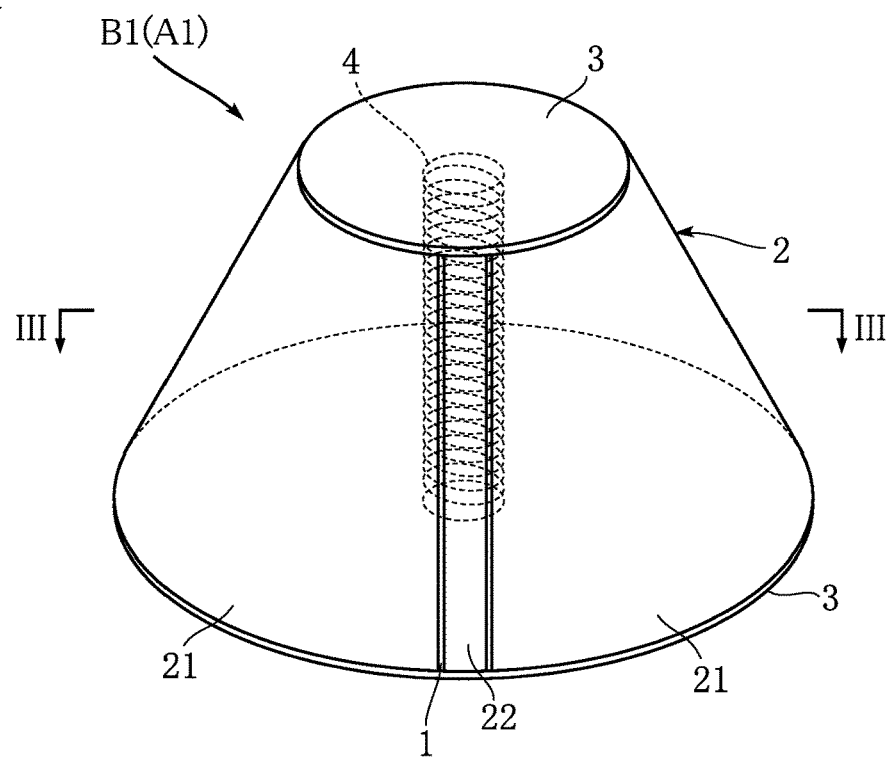
FIG. 1 is a perspective view showing a dielectric elastomer driving sensor system according to a first embodiment of the present invention.
Figure 2:
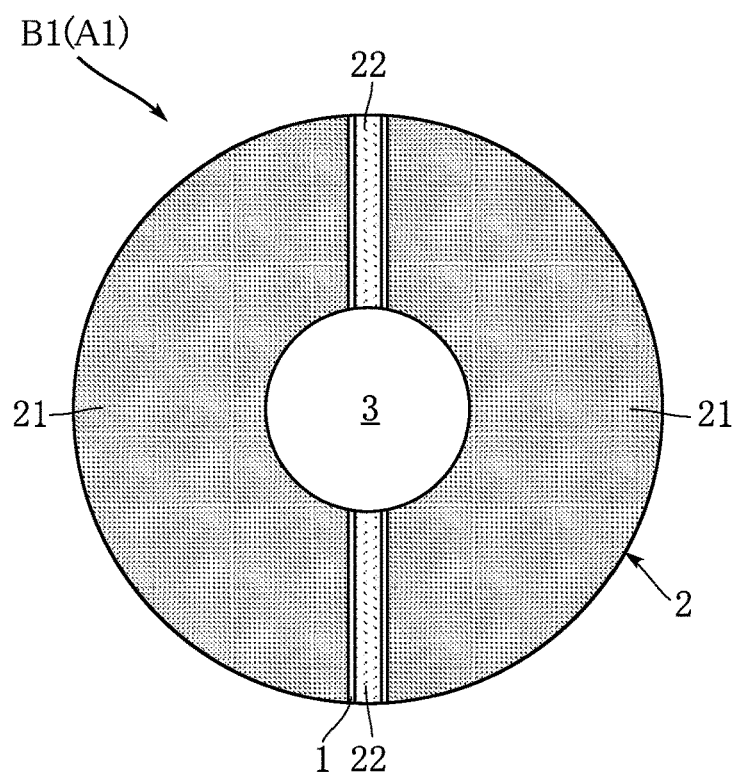
FIG. 2 is a plan view showing a dielectric elastomer driving sensor system according to the first embodiment of the present invention.
Figure 3:
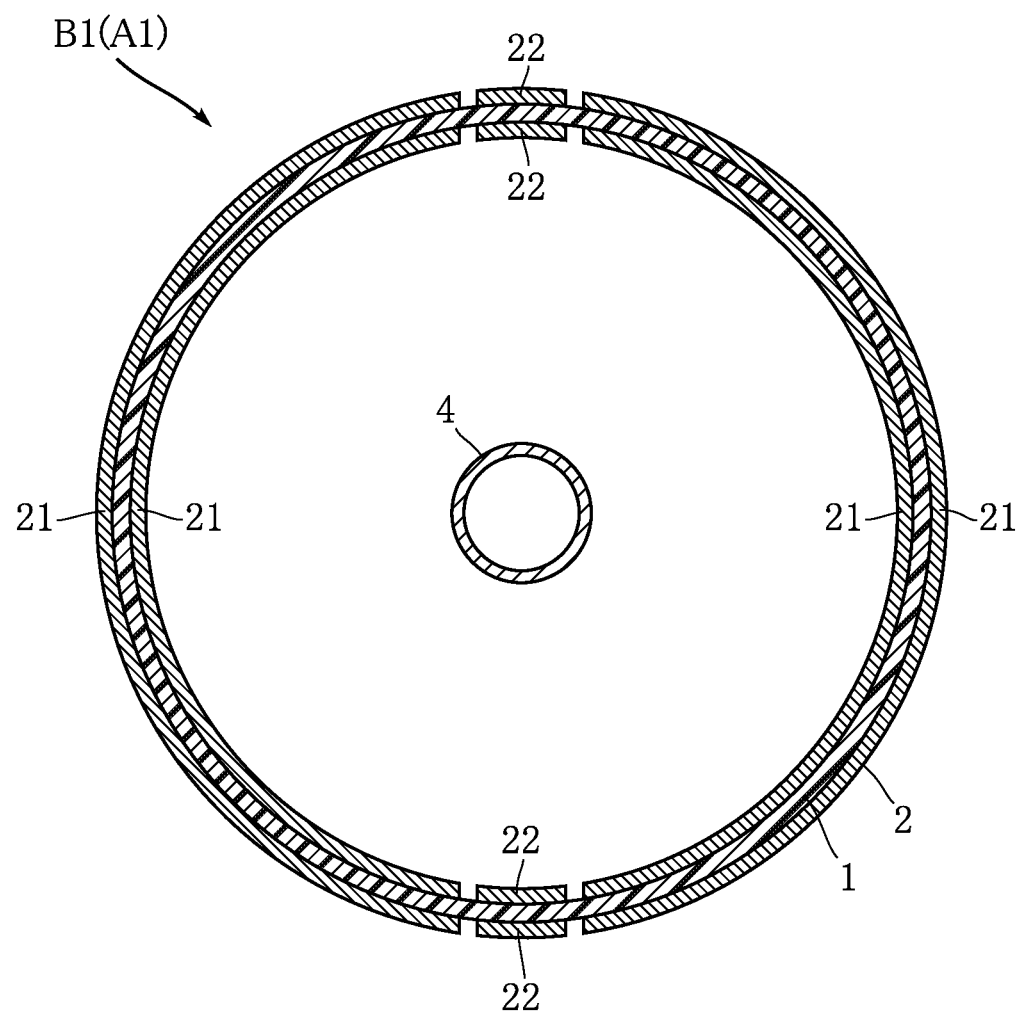
FIG. 3 is a cross-sectional view taken along line III-III in FIG. 1.
Figure 4:
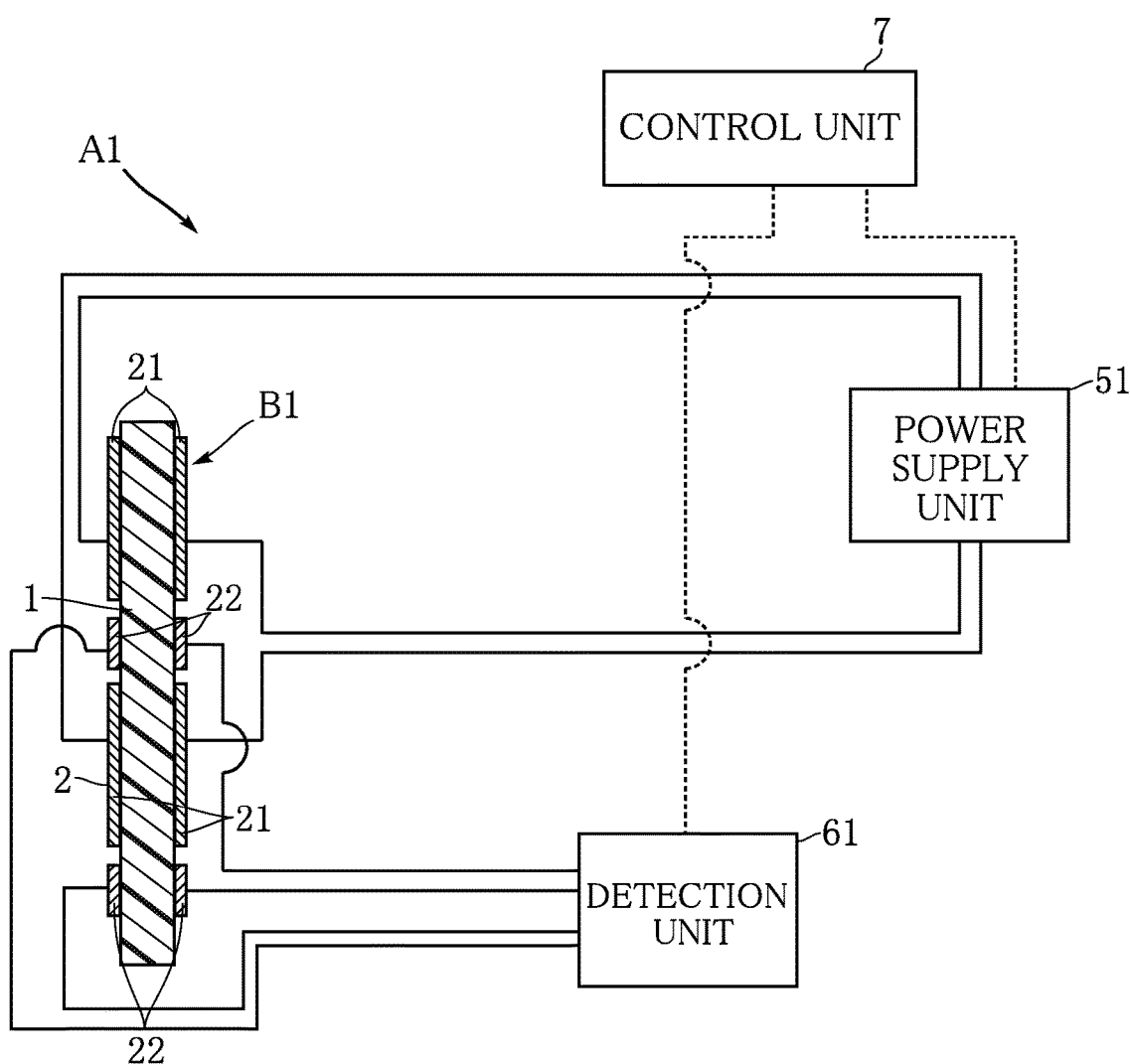
FIG. 4 is a system configuration diagram showing a dielectric elastomer driving sensor system according to the first embodiment of the present invention.

FIGS. 1 to 3 show a dielectric elastomer transducer portion of a dielectric elastomer driving sensor system according to a first embodiment of the present invention, and FIG. 4 shows the dielectric elastomer driving sensor system according to the first embodiment of the present invention. The dielectric elastomer driving sensor system A1 of the present embodiment is provided with a dielectric elastomer transducer portion B1, a power supply unit 51, a detection unit 61, and a control unit 7.

The dielectric elastomer transducer portion B1 of the present embodiment includes a dielectric elastomer layer 1, a pair of electrode layers 2, a pair of supports 3, and a spring 4. Note that the pair of supports 3 and the spring 4 are an example of structure for causing the dielectric elastomer layer 1 and the pair of electrode layers 2 of the dielectric elastomer transducer portion B1 to perform the driving function and the sensor function. The specific configuration of the dielectric elastomer transducer portion B1 is not limited, and need only be capable of performing the driving function and the sensor function.

The dielectric elastomer layer 1 is required to be elastically deformable and have high insulation strength. Although the material of such a dielectric elastomer layer 1 is not particularly limited, a silicone elastomer and an acrylic elastomer, for example, are given as preferred examples.

The pair of electrode layers 2 sandwich the dielectric elastomer layer 1. The electrode layers 2 are conductive and are formed using an elastically deformable material that can conform to the elastic deformation of the dielectric elastomer layer 1. A material obtained by mixing an elastically deformable main material with a filler that provides conductivity is given as an example of such a material. Carbon nanotubes, for example, are given as a preferred example of the filler.

The pair of supports 3 are members to which the upper end of the dielectric elastomer layer 1 is fixed. In the present embodiment, the pair of supports 3 are each formed by a circular-shaped plate member. The lower support 3 is larger than the upper support 3. For this reason, in the present embodiment, the dielectric elastomer layer 1 is formed in a circular truncated conical shape that is an aspect of a tubular shape. If the pair of supports 3 are the same size, the dielectric elastomer layer 1 is formed in a cylindrical shape that is an aspect of the tubular shape. Note that the "tubular shape" in the present invention means a shape that forms a ring viewed in the axial direction, and includes a shape in which the radial size is not constant at least in one of the circumferential direction and the axial direction. For example, an oval shape with a radial dimension that is not constant in the circumferential direction is included in the tubular shape. Also, the circular truncated conical shape is an example of an aspect in which the radial dimension is not constant in the axial direction.

The spring 4 is a tension generating member for generating tension by stretching the dielectric elastomer layer 1, and both ends of the spring 4 are respectively attached to the pair of supports 3. The figures show a state where no voltage is applied to the pair of the electrode layers 2. In this state, the spring 4 is compressed, and the dielectric elastomer layer 1 is stretched in the axial direction. In this manner, tension is generated in the dielectric elastomer layer 1.

As shown in FIGS. 1 to 3, the pair of electrode layers 2 are respectively provided on the inner surface and the outer surface of the dielectric elastomer layer 1. In the present embodiment, the pair of electrode layers 2 each have two driving regions 21 and two sensor regions 22. Note that, for the sake of understanding, in FIG. 2, the driving regions 21 are hatched with a relatively darker tone and the sensor regions 22 are hatched with a relatively lighter tone. The driving regions 21 and the sensor regions 22 are partitioned from each other by, for example, slits or the like, and are insulated from each other. The driving regions 21 cause the dielectric elastomer transducer portion B1 to function as an actuator due to the application of voltage performed by the power source unit 51. The sensor regions 22 cause the dielectric elastomer transducer portion B1 to function as a sensor due to the detection of changes in capacitance performed by the detection unit 61. The number, shape, and the like of the driving regions 21 and the sensor regions 22 are not limited at all. The number of driving regions 21 may be one or three or more, and the number of the sensor regions 22 may also be one or three or more.

As shown in FIGS. 2 and 3, the two driving regions 21 and the two sensor regions 22 are arranged alternatingly in the circumferential direction of the dielectric elastomer layer 1. In the present embodiment, the area of the driving region 21 is larger than the area of the sensor region 22. Furthermore, the two driving regions 21 and the two sensor regions 22 are in an arrangement with circumferential periodicity as viewed in the axial direction. Furthermore, in the present embodiment, the two driving regions 21 and the two sensor regions 22 are arranged point-symmetrically. In the shown examples, the two sensor regions 22 are regions that are band-shaped as viewed in the axial direction and are located on the opposite sides in the radial direction. Also, the size of each of the two driving regions 21 is almost half the size of the dielectric elastomer layer 1 as viewed in the axial direction. Note that, for the sake of illustrating the system configuration of the dielectric elastomer driving sensor system A1, FIG. 4 schematically shows the arrangement of the two driving regions 21 and the two sensor regions 22.

A power supply unit 51 applies a voltage for driving the dielectric elastomer transducer portion B1 to the two driving regions 21 of the pair of electrode layers 2. The specific configuration of the power supply unit 51 is not particularly limited, and need only be capable of applying a predetermined voltage to the pair of electrode layers 2 for a predetermined time period in response to an instruction from the control unit 7. In the present embodiment, the power supply unit 51 is configured to be capable of separately applying a voltage to each of the two driving regions 21.

The detection unit 61 regards the dielectric elastomer layer 1 and the two sensor regions 22 as a variable capacitor, and detects changes in capacitance of this variable capacitor. The technique of detecting capacitance is not particularly limited, and various conventionally known detection techniques may be adopted. The detection unit 61 includes, for example, a conventionally known CR oscillation circuit, an L/C oscillation circuit, an oscillation circuit using a timer IC or the like, and a circuit for generating AC electrical signals, for example.

Also, the detection unit 61 includes a detection circuit for detecting a change in a capacitance C of the dielectric elastomer transducer portion B1 on the basis of an output signal of the dielectric elastomer transducer portion B1 corresponding to an input from the oscillator circuit and the power source. The configuration of the detection circuit is not particularly limited, and need only be capable of detecting the relationship between the output signal of the dielectric elastomer transducer portion B1 and the capacitance C, based on various conventionally known techniques. The detection circuit is exemplified by a microcomputer, an L/C oscillation circuit, a counter, and the like. The detection unit 61 may also further include a determination circuit for determining if a change in capacitance that satisfies a predetermined reference has occurred based on a result of detecting an output signal of the dielectric elastomer transducer portion B1. The detection unit 61 may also include an intermediate circuit (not shown) for processing an output signal into a signal suitable for the determination circuit. This intermediate circuit includes, for example, an amplification circuit, a filter circuit, a wave detecting circuit, an A/D conversion IC, and a comparator, as appropriate.

In the present embodiment, with respect to detection processing performed by the detection unit 61, each of the two sensor regions 22 can separately perform detection.

The control unit 7 integrally controls the driving function and the sensor function of the dielectric elastomer transducer portion B1 by controlling the power supply unit 51 and the detection unit 61. The control unit 7 is provided with, for example, a CPU, an FPGA, a DSP, a memory, an interface, and the like.

Figure 5:
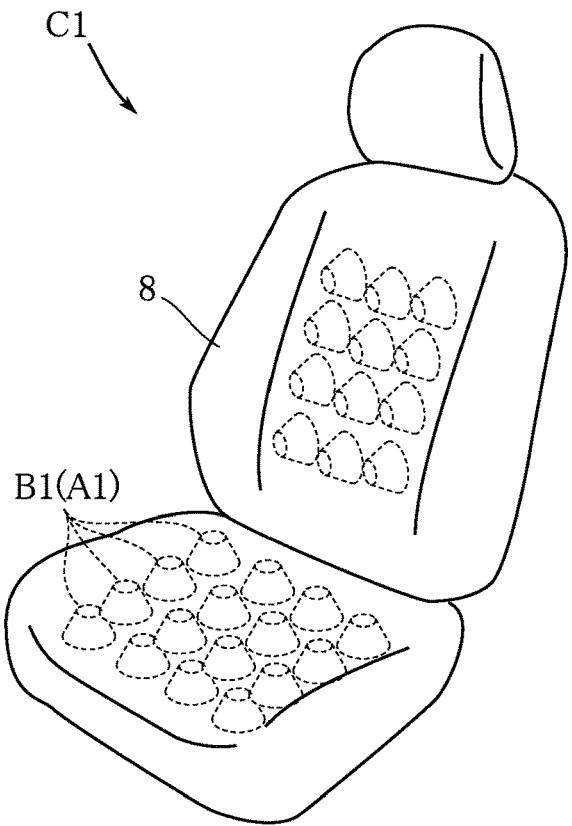
FIG. 5 is a perspective view showing a seat according to the first embodiment of the present invention.

FIG. 5 shows an application example of the dielectric elastomer driving sensor system A1. A seat C1 shown in FIG. 5 is provided with a seat body 8 and a dielectric elastomer driving sensor system A1. The seat C1 is for a user to sit on, and is used for various uses such as vehicles, ships, households, gaming, and caregiving. In the description below, an example in which the seat C1 is a vehicle seat will be illustrated.

The seat body 8 is used as an interior part for a vehicle, and provided with a seat face and a back support that are suitable for a passenger of the vehicle to sit thereon, and the like. In the seat C1, the plurality of dielectric elastomer transducer portions B1 of the dielectric elastomer driving sensor system A1 are arranged inside the seat face of the seat body 8. The plurality of the dielectric elastomer transducer portions B1 are arranged in a matrix, for example. A plurality of any or all the above-described power supply unit 51 and the detection unit 61 may be provided depending on the number of the plurality of dielectric elastomer transducer portions B1.

Next, the actions of the dielectric elastomer driving sensor system A1 and the dielectric elastomer transducer portion B1 will be illustrated.

According to the present embodiment, a pair of electrode layers 2 formed in one dielectric elastomer layer 1 include the driving regions 21 and the sensor regions 22 that are partitioned from each other. When a voltage is applied to the driving regions 21 from the power supply unit 51 according to an instruction from the control unit 7, the dielectric elastomer transducer portion B1 drives so as to stretch in the axial direction. At this time, the sensor regions 22 formed on this dielectric elastomer layer 1 are similarly stretched. Also, since the dielectric elastomer layer 1 becomes thinner, the pair of electrode layers 2 approach each other. On the other hand, the sensor regions 22 are not electrically influenced at all even when the voltage is applied to the driving regions 21. For this reason, it is possible to perform electric processing on the sensor regions 22 while performing the driving function by applying a voltage to the driving regions 21. Furthermore, due to the detection unit 61 detecting changes in capacitance C in the sensor regions 22, the control unit 7 can detect the deformation state of the dielectric elastomer transducer portion B1. Accordingly, with the dielectric elastomer driving sensor system A1, it is possible to perform both the driving function and the sensor function.

In the present embodiment, the area of the driving regions 21 is larger than the area of the sensor regions 22. The area of the driving regions 21 is correlated with the deformation amount of the dielectric elastomer layer 1. In the case where the same voltage is applied, the larger the area of the driving regions 21 is, the larger the deformation amount of the dielectric elastomer layer 1 becomes, and the more the drive amount of the dielectric elastomer transducer portion B1 can be increased. On the other hand, the area of the sensor regions 22 need only be capable of detecting the deformation amount of the dielectric elastomer layer 1 as the change in the capacitance C. For this reason, the correlation between the area of the sensor regions 22 and the accuracy of the sensor function is not very large. Accordingly, by setting the area of the driving regions 21 to be larger than the area of the sensor regions 22, it is possible to improve the driving function while maintaining the sensor function.

Furthermore, in the present embodiment, the pair of electrode layers 2 include the two driving regions 21. For this reason, when a voltage is applied to both driving regions 21, the entirety of the dielectric elastomer transducer portion B1 stretches in the axial direction, and when a voltage is applied to one of the driving regions 21, the dielectric elastomer transducer portion B1 deforms so as to be inclined to one side. In this manner, in the present embodiment, it is possible to set a plurality of operation modes of the dielectric elastomer transducer portion B1. Furthermore, due to the pair of electrode layers 2 having the two sensor regions 22, it is possible to separately detect the deformation amount of each portion of the dielectric elastomer layer 1 in which each sensor region 22 is provided. Accordingly, in the case where the dielectric elastomer transducer portion B1 is uniformly deformed in the axial direction and in the case where the dielectric elastomer transducer portion B1 is deformed so as to be inclined to one side, and the like, it is possible to detect such states as different deformation modes.

The two driving regions 21 are in an arrangement with circumferential periodicity as viewed in the axial direction, and are point-symmetric in the shown examples. Accordingly, in the case where a voltage is applied to both of the two driving regions 21, it is possible to deform the dielectric elastomer transducer portion B1 in a more balanced manner.

In the seat C1, it is possible to detect a load (weight) applied to the dielectric elastomer transducer portions B1 by using the sensor regions 22 of the dielectric elastomer transducer portions B1. Thereafter, the control unit 7 sets the deformation amount (repulsion force) to be generated by the driving function of each dielectric elastomer transducer portion B1 based on the load applied to the dielectric elastomer transducer portion B1, for example. Thereafter, in accordance with the deformation amount (repulsion force) set for each dielectric elastomer transducer portion B1, by applying a voltage to each driving region 21 from the power supply unit 51, the control unit 7 performs control such that the repulsion force of a region that is subjected to a relatively large load is suppressed to be relatively small, and a region that is subjected to a relatively small load is supported by a relatively large repulsion force. In this manner, the load applied to the plurality of dielectric elastomer transducer portions B1 can be distributed more uniformly. Accordingly, with the dielectric elastomer driving sensor system A1, it is possible to support a passenger more comfortably even in the case where the load distribution on the seat face of the seat body 8 differs depending on the body type of each passenger or the like.

In the dielectric elastomer driving sensor system A1, it is possible to perform the driving function and the sensor function at the same time. For example, while a vehicle in which the seat C1 is mounted is traveling, various accelerations such as a traveling acceleration and engine vibrations act on a passenger, and the load distribution may change in various ways. According to the dielectric elastomer driving sensor system A1, it is possible to detect changes in the load distribution in real time. Moreover, it is possible to change the repulsion force of each dielectric elastomer transducer portion B1 according to the changes in the load distribution without delay. Accordingly, according to the seat C1, it is possible to support the passenger more appropriately, mitigate uncomfortable vibrations that are transmitted to the passenger, and so on, in accordance with changes in the load distribution on the seat body 8 while the vehicle is traveling. Furthermore, by adjusting and controlling the repulsion force of the dielectric elastomer transducer portion B1 in accordance with traveling conditions, it is possible to use the dielectric elastomer driving sensor system A1 for various uses such as suppressing vibration by applying the opposite phase vibrations, generation of a supporting force in accordance with a centrifugal force generated when the vehicle passes a curve, suppressing change in the posture when the vehicle accelerates/decelerates, a massage effect obtained by actively generating vibration, and so on.

FIGS. 6 to 9 show modified examples and other embodiments of the present invention. Note that, in these diagrams, the same reference signs as in the above embodiment are given to elements that are the same as or similar to those of the above embodiment.

Figure 6:
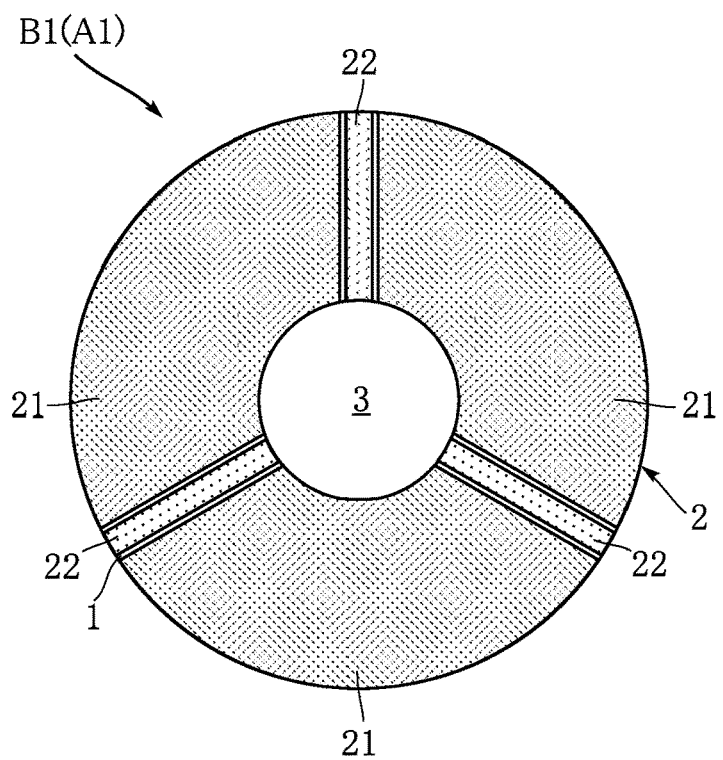
FIG. 6 is a plan view showing an example of a variation of a dielectric elastomer transducer portion.

FIG. 6 shows a modified example of the dielectric elastomer transducer portion B1. In this modified example, the electrode layer 2 includes three driving regions 21 and three sensor regions 22. In the circumferential direction, one driving region 21 and one sensor regions 22 form a pair, and three pairs of the driving regions 21 and the sensor regions 22 are in an arrangement with periodicity.

In this variation example as well, it is possible to deform the dielectric elastomer transducer portion B1 in a more balanced manner when a voltage is applied to all the three driving regions 21. In other words, even in the case where the arrangement of the driving regions 21 and the sensor regions 22 is not point symmetry, if the arrangement has circumferential periodicity, such arrangement contributes to a balanced deformation.

Figure 7:
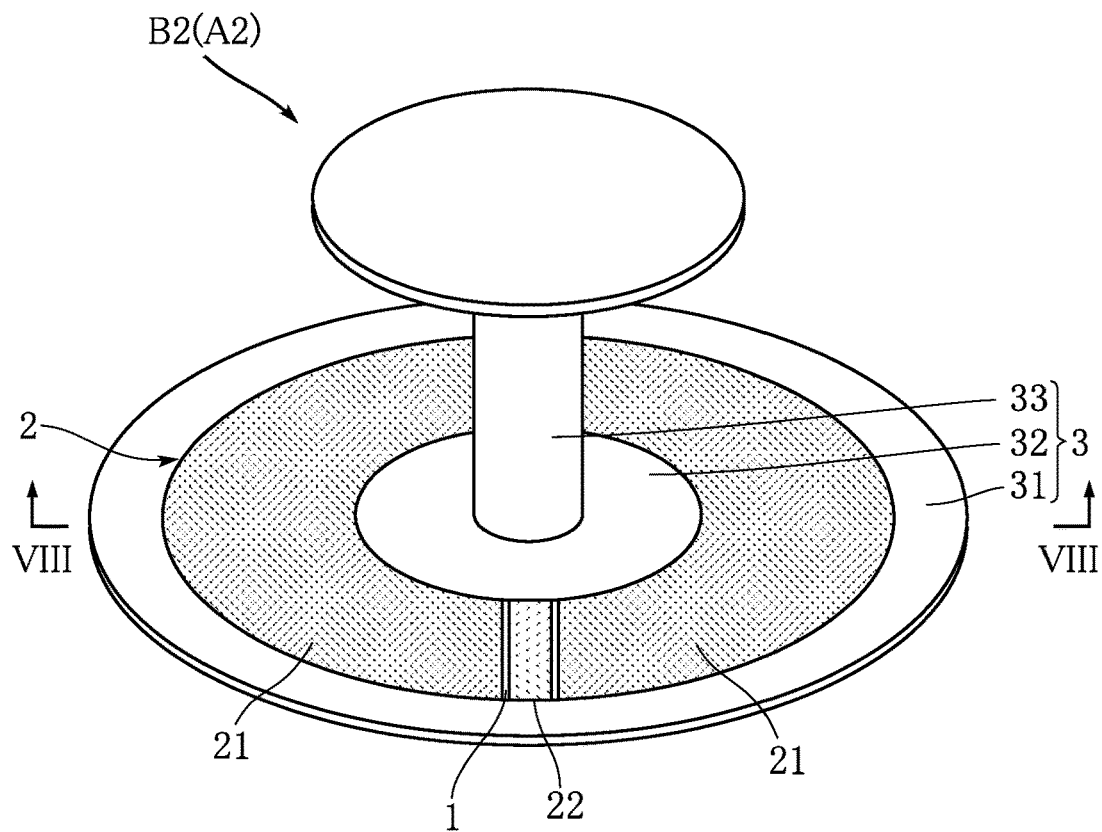
FIG. 7 is a perspective view showing a dielectric elastomer driving sensor system according to a second embodiment of the present invention.
Figure 8:
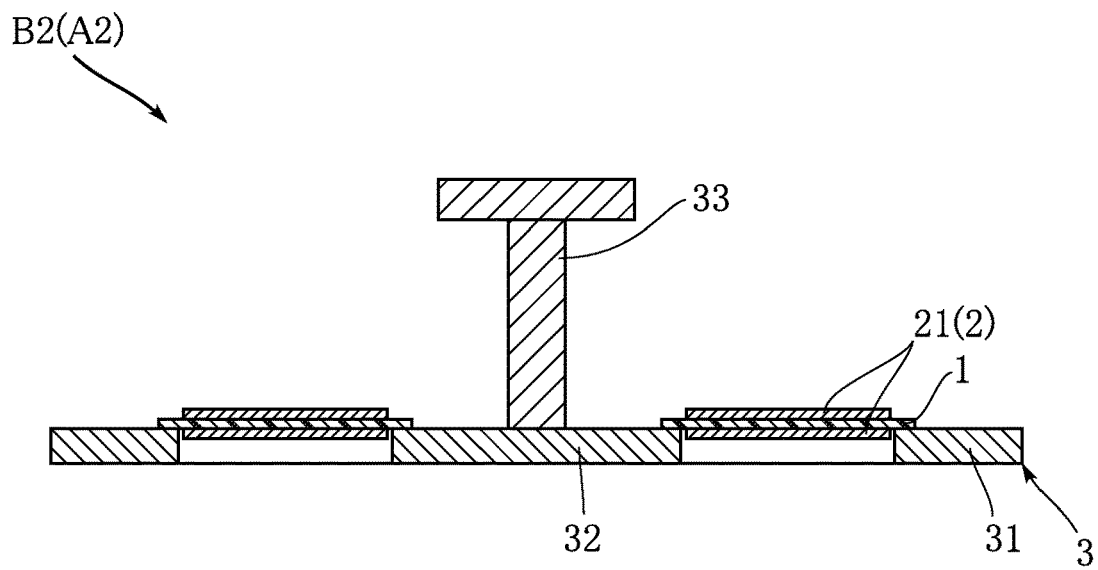
FIG. 8 is a cross-sectional view taken along line VIII-VIII in FIG. 7.
Figure 9:
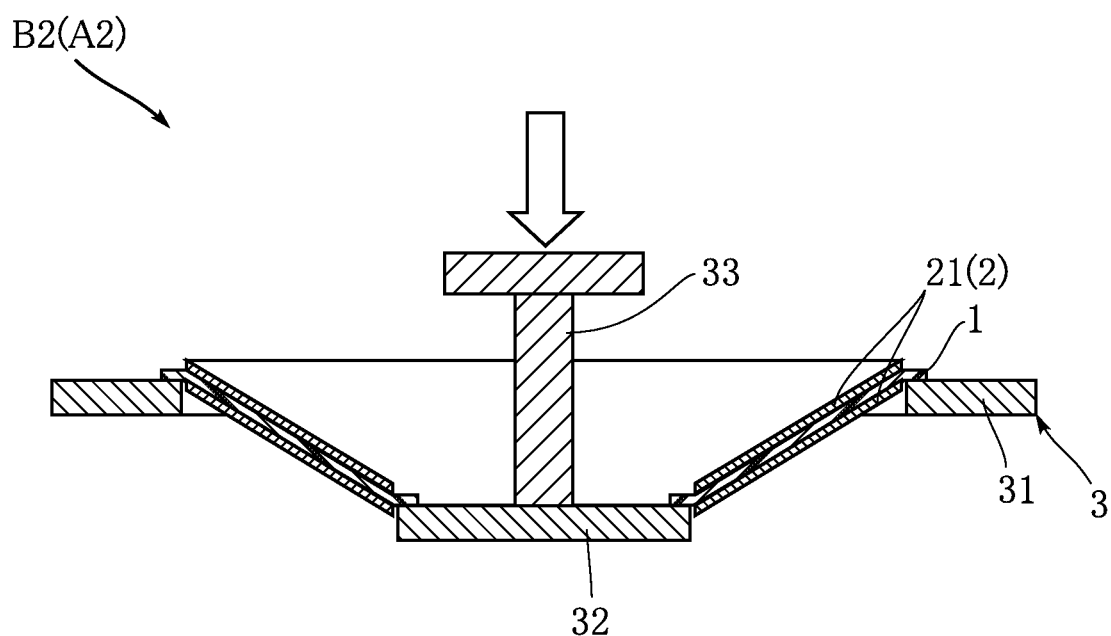
FIG. 9 is a cross-sectional view showing a state where an external force is acting on the dielectric elastomer transducer portion in FIG. 7.

FIGS. 7 to 9 show a dielectric elastomer driving sensor system according to a second embodiment of the present invention. A dielectric elastomer driving sensor system A2 of the present embodiment is provided with a dielectric elastomer transducer unit B2. The dielectric elastomer transducer portion B2 is provided with a dielectric elastomer layer 1, an electrode layer 2 and a support 3. On the other hand, the dielectric elastomer transducer portion B2 is not provided with a spring 4 serving as a tension generation member that generates tension by stretching the dielectric elastomer layer 1 in the above-described embodiment.

The support 3 in the present embodiment includes a fixing portion 31, a movable portion 32, and an external force transmission portion 33. The fixing portion 31 is a portion that maintains the fixed state when an external force acts thereon due to sitting of the passenger or the like, and is attached to the seat body 8, for example. The movable portion 32 is a portion that moves relative to the fixed portion 31 when an external force acts thereon. In the present embodiment, the outer circumferential portion of the dielectric elastomer layer 1 that is shaped like a circular ring as viewed in the axial direction is attached to the fixed portion 31, and the inner circumferential portion is attached to the movable portion 32. The external force transmission portion 33 is attached to the movable portion 32, and transmits external forces generated by sitting and the like to the movable portion 32. In the shown examples, the external force transmission portion 33 includes a rod-like portion and a circular plate-like portion provided at the upper end of the rod-like portion.

FIGS. 7 and 8 show an initial state in which no passenger is sitting on the seat. In this state, no clear stretching is being applied and no significant tension is being generated in the dielectric elastomer layer 1. FIG. 9 shows a state in which the weight of the passenger acts on the external force transmission portion 33 due to the sitting of a passenger thereon or the like, and an external force that acts downward in the figure acts on the external force transmission portion 33. This external force is transmitted to the movable portion 32 via the external transmission portion 33. For this reason, the movable portion 32 moves downward in the figure relative to the fixed portion 31. Due to this relative motion of the movable portion 32, the dielectric elastomer layer 1 is stretched and shaped like a circular truncated cone.

In the state shown in FIG. 9, in the case where no voltage is applied to the driving regions 21 of the pair of electrode layers 2, the elastic force (repulsion force) generated in the dielectric elastomer layer 1 of the dielectric elastomer transducer portion B2 is at its maximum level. The larger the voltage applied to the driving regions 21 of the pair of electrode layers 2 is, the smaller the elastic force (repulsion force) of the dielectric elastomer layer 1 becomes. The control unit 7 controls the power supply unit 51 with consideration given to the correlation between the voltage applied to the driving regions 21 of the above-described pair of electrode layers 2 and the repulsion force, in accordance with a result detected by the detection unit 61 with respect to a change in capacitance of the sensor regions 22 of the pair of electrode layers 2.

In the present embodiment as well, both the driving function and the sensor function can be performed. Furthermore, due to the configuration in which the dielectric elastomer layer 1 is stretched using the external force caused by the sitting or the like, it is not necessary to provide the spring 4 and the like in the dielectric elastomer driving sensor system A1. This is preferable in terms of reducing the weight of the dielectric elastomer transducer portion B2.

The dielectric elastomer driving sensor system and the seat according to the present invention are not limited to the above-described embodiments. Various design changes can be freely made to the specific configuration of respective parts of the dielectric elastomer driving sensor system and the seat according to the invention.

Clause 1.

A dielectric elastomer driving sensor system comprising:
a dielectric elastomer transducer portion including a dielectric elastomer layer and a pair of electrode layers that sandwich the dielectric elastomer layer, where the pair of electrode layers include a driving region and a sensor region that are partitioned from each other;
a power supply unit that applies a voltage to the driving region;
a detection unit that detects a change in capacitance in the sensor region; and
a control unit that controls the power supply unit and the detection unit.

Clause 2.

The dielectric elastomer driving sensor system according to clause 1, wherein an area of the driving region is larger than an area of the sensor region.

Clause 3.

The dielectric elastomer driving sensor system according to clause 1 or 2, wherein the dielectric elastomer layer has a tubular shape, and
the driving region and the sensor region are arranged along a circumferential direction of the dielectric elastomer layer.

Clause 4.

The dielectric elastomer driving sensor system according to clause 3, wherein the pair of electrode layers include a plurality of driving regions and a plurality of sensor regions.

Clause 5.

The dielectric elastomer driving sensor system according to clause 4, wherein the plurality of driving regions and the plurality of sensor regions are in an arrangement with circumferential periodicity as viewed in an axial direction of the dielectric elastomer layer.

Clause 6.

The dielectric elastomer driving sensor system according to any one of clauses 1 to 5, wherein the dielectric elastomer transducer portion further includes a support having a fixed portion and a movable portion that are each attached to the dielectric elastomer layer, and
the dielectric elastomer layer is stretched due to an external force being transmitted to the movable portion and the movable portion moving relative to the fixed portion.

Clause 7.

A seat comprising:
a dielectric elastomer driving sensor system according to any one of clauses 1 to 6; and
a seat body to which the dielectric elastomer transducer portion is attached.

The invention claimed is:

1. A dielectric elastomer driving sensor system comprising:
a dielectric elastomer transducer portion including a dielectric elastomer layer and a pair of electrode layers that sandwich the dielectric elastomer layer, the pair of electrode layers including a driving region and a sensor region that are partitioned from each other;
a power supply unit that applies a voltage to the driving region;
a detection unit that detects a change in capacitance in the sensor region; and
a control unit that controls the power supply unit and the detection unit, wherein
the control of the power supply unit by the control unit is carried out in association with a detection value of the change in capacitance.

2. The dielectric elastomer driving sensor system according to claim 1, wherein an area of the driving region is larger than an area of the sensor region.

3. The dielectric elastomer driving sensor system according to claim 1, wherein the dielectric elastomer layer has a tubular shape, and
the driving region and the sensor region are arranged along a circumferential direction of the dielectric elastomer layer.

4. The dielectric elastomer driving sensor system according to claim 3, wherein the pair of electrode layers include a plurality of driving regions and a plurality of sensor regions.

5. The dielectric elastomer driving sensor system according to claim 4, wherein the plurality of driving regions and the plurality of sensor regions are in an arrangement with circumferential periodicity as viewed in an axial direction of the dielectric elastomer layer.

6. The dielectric elastomer driving sensor system according to claim 1, wherein the dielectric elastomer transducer portion further includes a support having a fixed portion and a movable portion that are each attached to the dielectric elastomer layer, and
the dielectric elastomer layer is stretched due to an external force being transmitted to the movable portion and the movable portion moving relative to the fixed portion.

7. A seat comprising:
a dielectric elastomer driving sensor system according to claim 1; and
a seat body to which the dielectric elastomer transducer portion is attached.

8. A dielectric elastomer driving sensor system comprising:
a dielectric elastomer transducer portion including a dielectric elastomer layer and a pair of electrode layers that sandwich the dielectric elastomer layer, the pair of electrode layers including a driving region and a sensor region that are partitioned from each other;
a power supply unit that applies a voltage to the driving region;
a detection unit that detects a change in capacitance in the sensor region;
a control unit that controls the power supply unit and the detection unit, wherein the dielectric elastomer layer has a tubular shape, and
the driving region and the sensor region are arranged along a circumferential direction of the dielectric elastomer layer.

9. The dielectric elastomer driving sensor system according to claim 8, wherein the pair of electrode layers include a plurality of driving regions and a plurality of sensor regions.

10. The dielectric elastomer driving sensor system according to claim 9, wherein the plurality of driving regions and the plurality of sensor regions are in an arrangement with circumferential periodicity as viewed in an axial direction of the dielectric elastomer layer.

11. A dielectric elastomer driving sensor system comprising:
a dielectric elastomer transducer portion including a dielectric elastomer layer and a pair of electrode layers that sandwich the dielectric elastomer layer, the pair of electrode layers including a driving region and a sensor region that are partitioned from each other;
a power supply unit that applies a voltage to the driving region;

a detection unit that detects a change in capacitance in the sensor region;

a control unit that controls the power supply unit and the detection unit, wherein the dielectric elastomer transducer portion further includes a support having a fixed portion and a movable portion that are each attached to the dielectric elastomer layer, and the dielectric elastomer layer is stretched due to an external force being transmitted to the movable portion and the movable portion moving relative to the fixed portion.

\* \* \* \* \*